(12) United States Patent
Glaser et al.

(10) Patent No.: US 9,576,725 B2
(45) Date of Patent: Feb. 21, 2017

(54) METHOD FOR REDUCING INTERWINDING CAPACITANCE CURRENT IN AN ISOLATION TRANSFORMER

(71) Applicant: General Electric Company, Schenectady, NY (US)

(72) Inventors: John Stanley Glaser, Schenectady, NY (US); Joseph Taher Mossoba, Cambridge, MA (US)

(73) Assignee: General Electric Company, Niskayuna, NY (US)

( * ) Notice: Subject to any disclaimer, the term of this patent is extended or adjusted under 35 U.S.C. 154(b) by 498 days.

(21) Appl. No.: 13/730,332

(22) Filed: Dec. 28, 2012

(65) Prior Publication Data

US 2014/0184186 A1   Jul. 3, 2014

(51) Int. Cl.
| | |
|---|---|
| H01F 27/36 | (2006.01) |
| H02M 1/08 | (2006.01) |
| H01F 27/38 | (2006.01) |
| H03K 17/567 | (2006.01) |
| H01F 19/08 | (2006.01) |
| H02M 1/00 | (2006.01) |
| H03K 17/691 | (2006.01) |

(52) U.S. Cl.
CPC ............ *H01F 27/362* (2013.01); *H01F 27/38* (2013.01); *H03K 17/567* (2013.01); *H01F 2019/085* (2013.01); *H02M 1/08* (2013.01); *H02M 2001/0006* (2013.01); *H03K 17/691* (2013.01)

(58) Field of Classification Search
CPC ............. H02M 1/08; H02M 2001/0006; H01F 27/362; H01F 27/38
See application file for complete search history.

(56) References Cited

U.S. PATENT DOCUMENTS

| | | | | |
|---|---|---|---|---|
| 1,845,306 A | * | 2/1932 | MacDonald | H03J 3/06 330/167 |
| 2,068,769 A | * | 1/1937 | Schlesinger | H03D 1/16 329/363 |
| 2,354,959 A | * | 8/1944 | McCoy | H03D 1/10 329/317 |
| 2,553,324 A | * | 5/1951 | Lord | H01F 27/362 333/178 |

(Continued)

FOREIGN PATENT DOCUMENTS

JP   20020237423 A   8/2002

OTHER PUBLICATIONS

Cove, Samuel R., et al.; "Applying Response Surface Methodology to Planar Transformer Winding Design"; Energy Conversion Congress and Exposition (ECCE), 2010, pp. 2182-2187.

*Primary Examiner* — Timothy J Dole
*Assistant Examiner* — Yusef Ahmed
(74) *Attorney, Agent, or Firm* — Pabitra K. Chakrabarti

(57) ABSTRACT

Systems and methods are disclosed for reducing an interwinding capacitance current in a transformer. In certain embodiments, the transformer includes a coupling winding and a primary winding that encircles a portion of the coupling winding. Additionally, the transformer includes a secondary winding that encircles a portion of the coupling winding. The transformer includes a shield terminal which is electrically coupled to the coupling winding. The shield terminal directs currents, such as interwinding capacitance currents, in the coupling winding to ground.

15 Claims, 10 Drawing Sheets

(56) References Cited

U.S. PATENT DOCUMENTS

| | | | | |
|---|---|---|---|---|
| 2,785,279 A * | 3/1957 | Williams | B23H 1/00 | 219/69.14 |
| 2,791,646 A * | 5/1957 | Keroes | H03F 3/22 | 330/122 |
| 2,815,408 A * | 12/1957 | Hafler | H01F 19/02 | 330/122 |
| 2,827,519 A * | 3/1958 | Morris | H04Q 11/04 | 379/373.01 |
| 2,896,096 A * | 7/1959 | Schwarzer | H04B 15/02 | 307/150 |
| 3,061,804 A * | 10/1962 | Bereskin | H01F 19/02 | 336/170 |
| 3,074,012 A * | 1/1963 | Smith-Vaniz, Jr. | | 323/330 |
| 3,143,720 A * | 8/1964 | Rogers | G11C 11/44 | 310/10 |
| 3,153,758 A * | 10/1964 | Kusters | G01R 1/28 | 324/726 |
| 3,234,478 A * | 2/1966 | Braymer | H03F 1/303 | 330/10 |
| 3,277,416 A * | 10/1966 | Barr | H05K 9/0064 | 336/189 |
| 3,299,384 A * | 1/1967 | Lee | H01F 19/00 | 333/24 R |
| 3,500,197 A * | 3/1970 | Constable | H01F 27/402 | 324/127 |
| 3,665,150 A * | 5/1972 | Mejia | B23K 9/1056 | 219/130.1 |
| 3,717,808 A * | 2/1973 | Horna | H01F 27/362 | 323/305 |
| 3,786,338 A * | 1/1974 | Gilbert | H03M 1/00 | 323/359 |
| 4,089,049 A * | 5/1978 | Suzuki et al. | | 363/17 |
| 4,124,822 A * | 11/1978 | Naylor | A61B 5/04004 | 330/10 |
| 4,806,896 A * | 2/1989 | Shikano | H01F 27/365 | 336/174 |
| 4,977,301 A * | 12/1990 | Maehara et al. | | 219/715 |
| 5,023,768 A * | 6/1991 | Collier | H01F 30/16 | 336/175 |
| 5,514,964 A * | 5/1996 | Benesh | G01R 31/025 | 324/509 |
| 5,521,573 A * | 5/1996 | Inoh | H01F 27/2804 | 336/180 |
| 6,005,355 A * | 12/1999 | Siao | H05B 41/2822 | 315/205 |
| 6,023,214 A * | 2/2000 | Ohta | H01F 27/2804 | 336/200 |
| 6,549,431 B2 * | 4/2003 | Odell | H01F 27/34 | 363/21.12 |
| 6,583,994 B2 * | 6/2003 | Clayton | H02M 1/44 | 363/131 |
| 6,963,262 B2 * | 11/2005 | Mayfield | H01F 27/362 | 336/84 C |
| 6,982,621 B2 * | 1/2006 | Park | H01F 27/367 | 336/84 C |
| 7,084,728 B2 * | 8/2006 | Hyvonen | H01F 17/0013 | 336/200 |
| 7,256,675 B2 * | 8/2007 | Chen | H01F 29/14 | 336/180 |
| 7,616,088 B1 * | 11/2009 | Baker et al. | | 336/229 |
| 7,768,369 B2 * | 8/2010 | Park | H01F 27/289 | 336/84 C |
| 8,446,743 B2 * | 5/2013 | Gupta | H02M 5/297 | 363/131 |
| 8,629,746 B2 * | 1/2014 | Lu | | 336/84 C |
| 2002/0012257 A1 * | 1/2002 | Takahama et al. | | 363/95 |
| 2002/0097130 A1 * | 7/2002 | Vinciarelli et al. | | 336/212 |
| 2004/0004524 A1 | 1/2004 | Mayfield | | |
| 2004/0032753 A1 * | 2/2004 | Liu et al. | | 363/39 |
| 2004/0125628 A1 | 7/2004 | Yamada et al. | | |
| 2004/0196668 A1 * | 10/2004 | Park | H01F 27/367 | 363/16 |
| 2007/0046411 A1 | 3/2007 | Chin | | |
| 2007/0171585 A1 * | 7/2007 | Sicong et al. | | 361/38 |
| 2007/0188283 A1 * | 8/2007 | Weimert et al. | | 336/90 |
| 2007/0268106 A1 * | 11/2007 | Lee et al. | | 336/200 |
| 2008/0094160 A1 | 4/2008 | Wang et al. | | |
| 2008/0247206 A1 * | 10/2008 | Park | H02M 3/33523 | 363/126 |
| 2009/0066391 A1 * | 3/2009 | Tao et al. | | 327/291 |
| 2009/0212754 A1 * | 8/2009 | Ryan | H02M 1/14 | 323/282 |
| 2009/0243683 A1 * | 10/2009 | Ochi et al. | | 327/171 |
| 2010/0141234 A1 | 6/2010 | Dinsmore et al. | | |
| 2010/0289610 A1 * | 11/2010 | Jacobson | H01F 27/2804 | 336/84 C |
| 2011/0035607 A1 | 2/2011 | Ikriannikov | | |
| 2011/0090719 A1 * | 4/2011 | Benjamin | | 363/34 |
| 2011/0156697 A1 * | 6/2011 | Gunn | G01R 15/185 | 324/127 |
| 2011/0291792 A1 * | 12/2011 | Lu | H01F 27/2804 | 336/84 R |
| 2012/0300507 A1 * | 11/2012 | Chen | H02M 3/33523 | 363/21.16 |
| 2013/0242452 A1 * | 9/2013 | Park | | 361/143 |
| 2013/0321116 A1 * | 12/2013 | Tiemeijer | | 336/200 |
| 2013/0335182 A1 * | 12/2013 | Zybura | H01F 19/04 | 336/170 |
| 2014/0125386 A1 * | 5/2014 | Tajima et al. | | 327/109 |
| 2014/0185337 A1 * | 7/2014 | Espino | H01F 27/362 | 363/21.17 |
| 2015/0028979 A1 * | 1/2015 | Barry | H01F 19/04 | 336/170 |

* cited by examiner

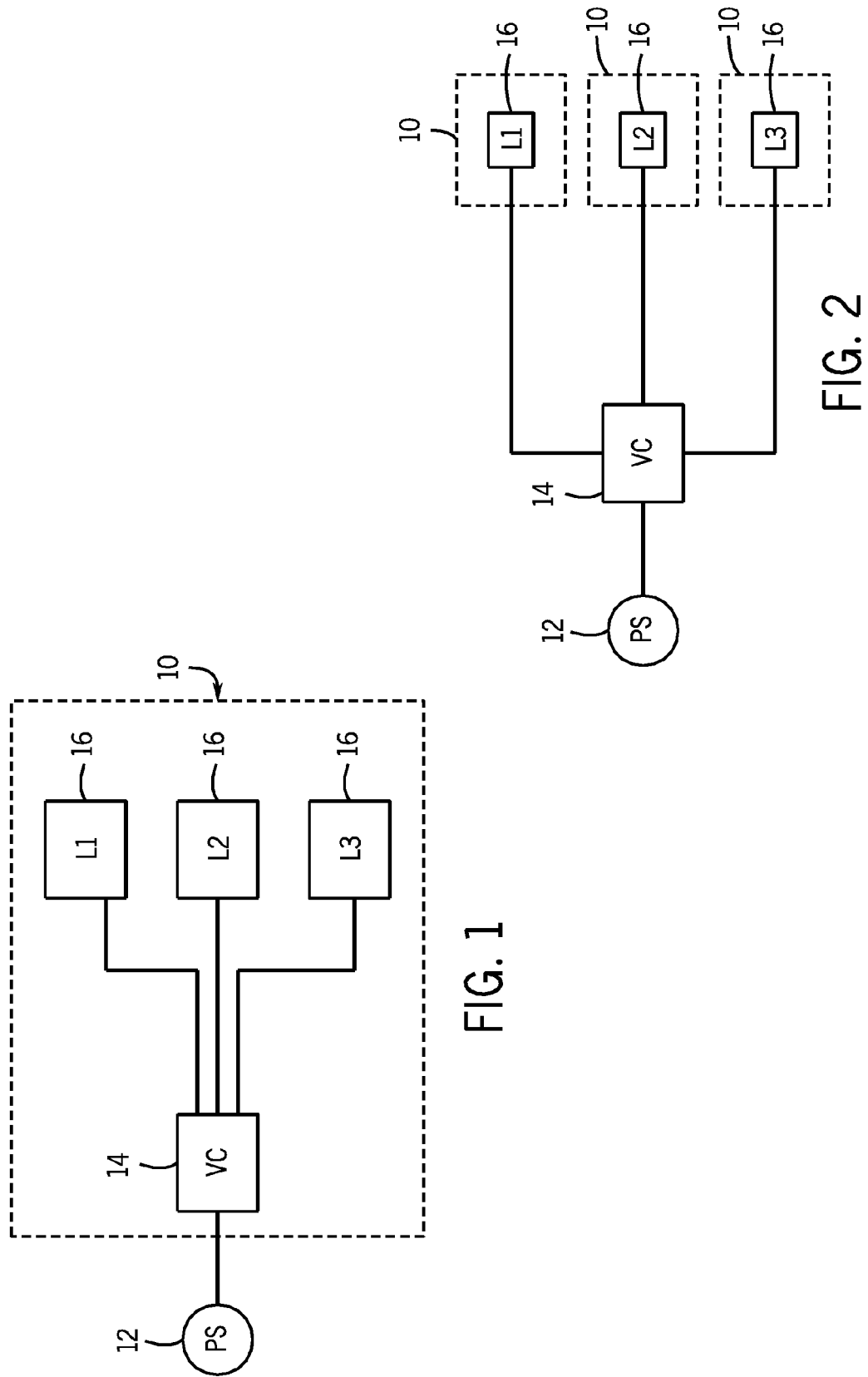

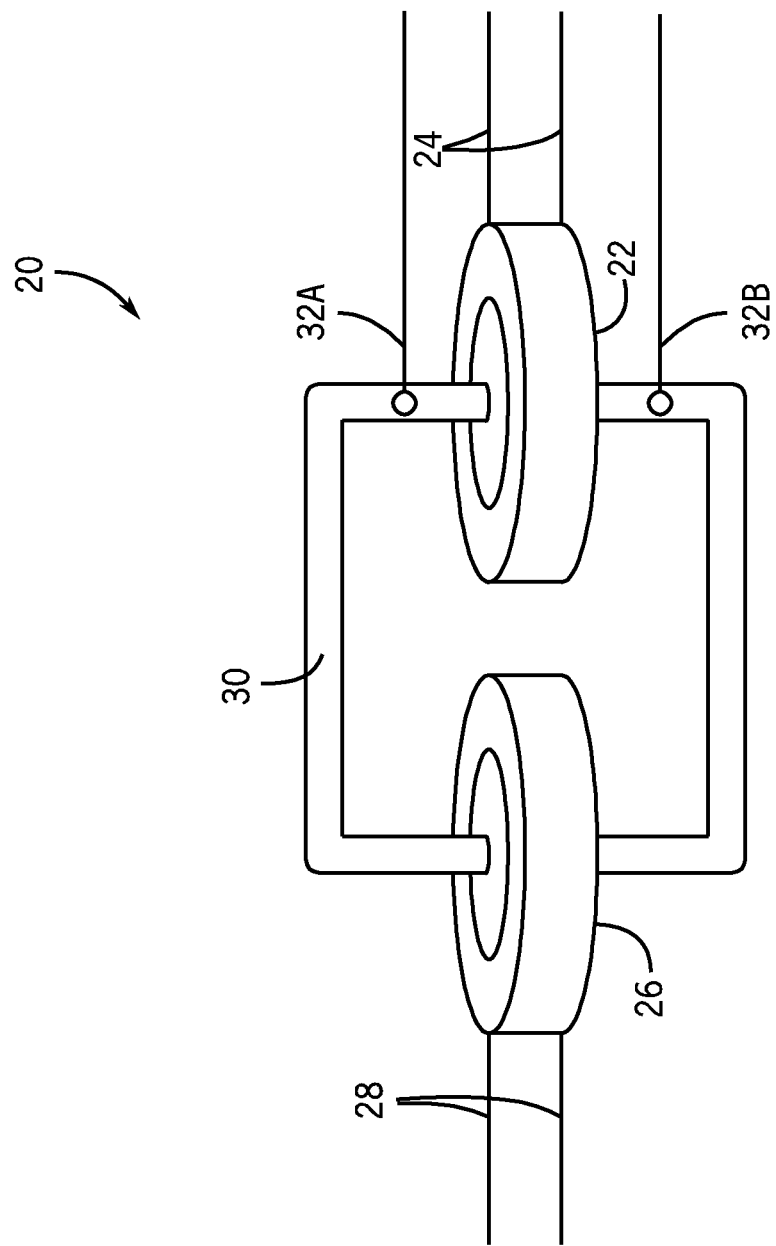

METHOD FOR REDUCING INTERWINDING CAPACITANCE CURRENT IN AN ISOLATION TRANSFORMER

STATEMENT REGARDING FEDERALLY SPONSORED RESEARCH & DEVELOPMENT

This invention was made with Government support under contract number N00014-07-C-0415 awarded by the Office of Naval Research. The Government has certain rights in the invention.

BACKGROUND

The subject matter disclosed herein relates to isolation transformers, and more specifically, methods for reducing the interwinding capacitance of an isolation transformer.

In certain applications, a transformer may be utilized to provide power or transmit voltage signals to an electronic circuit or load while maintaining galvanic isolation between the power source and the load. Galvanic isolation involves physically isolating function components of an electrical system to prevent current flow between the components. As an example, a transformer may provide galvanic isolation between a transistor and the control circuitry which provides the signals that may turn the transistor on and off. A transformer providing galvanic isolation could receive the signals from the control circuitry at a pair of input terminals and mirror the voltage on the output terminals. However, internal capacitances may allow currents to flow through the transformer, compromising the isolation provided by the transformer. The currents can potentially disrupt or damage any circuitry attached to the transformer.

BRIEF DESCRIPTION

In one embodiment, a transformer includes a coupling winding and a primary winding that encircles a first portion of the coupling winding. Additionally, the transformer includes a secondary winding that encircles a second portion of the coupling winding. A shield terminal is electrically coupled to the coupling winding so that the shield terminal may direct a current in the coupling winding to ground.

In another embodiment, a voltage converter circuit includes a voltage source and a transistor configured to allow a current from the voltage source to flow when activated, and to prevent the current from the voltage source from flowing when not activated. The voltage converter circuit also includes control circuitry that is designed to activate and deactivate the transistor. Additionally, the voltage converter circuit includes a transformer disposed between the control circuitry and the transistor. The transformer is designed to provide isolation between the transistor and the control circuitry and includes a shield terminal that is designed to direct an interwinding current to ground.

In a further other embodiment, a method for maintaining galvanic isolation between a power source and a load includes electrically coupling a transformer between the power source and the load, and electrically coupling the coupling winding of the transformer to ground.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIG. 1 is a system level diagram of an electrical system receiving power from a power source in accordance with certain embodiments of the present disclosure;

FIG. 2 is a system level diagram of multiple electrical systems receiving power from a power source in accordance with certain embodiments of the present disclosure;

FIG. 12 is an illustration of a side by side arrangement of the primary and secondary windings in an isolation transformer.

DETAILED DESCRIPTION

Figure 4:
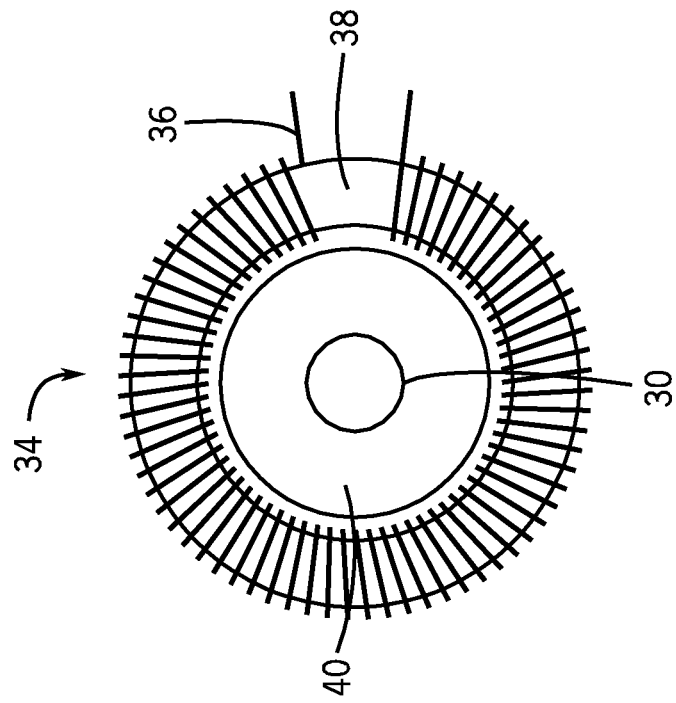
FIG. 4 is an illustration of a toroid winding of an isolation transformer in accordance with certain embodiments of the present disclosure.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements Aspects of the present disclosure relate to a transformer configured to provide power and/or voltage signals to a load while maintaining galvanic isolation between a power source and the load. In an embodiment, a transformer includes a primary coil, a secondary coil, and one or more shield terminals that may be connected to ground or an alternating current (AC) ground to draw a common mode current that may have conducted through an interwinding capacitance of the primary and secondary coils to ground. The common mode current may be caused by AC signals applied to the terminals of the transformer, which may form currents that can flow through the winding capacitance of the coils. In another embodiment, additional secondary coils are utilized to provide power to additional loads and provide further isolation between the primary and the secondary coil. The terminals of the additional secondary coils are connected to a fixed direct current (DC) source that provides an AC ground to draw common mode currents flowing through a capacitance formed between coils of the transformer.

With the foregoing in mind, FIG. 1 illustrates a system-level diagram of an electrical system 10 powered by a power source 12. The electrical system 10 may refer to any electrical system that utilizes a power source 12 and a voltage converter 14 to receive power. In certain embodiments, the electrical system may be a portable consumer device such as a laptop or a cellphone. In other embodiments, the electrical system may be a larger electrical system such as a television, an electrically powered vehicle, or a high voltage utility grid interface. During operation, the power source 12 may provide power to the voltage converter 14 at a specific voltage. The power source 12 may provide power from energy storage devices such as batteries or fuel cells, electromechanical systems such as generators or alternators, solar panels, or electrical energy transmission systems such as power supplies that convert an AC line voltage to a DC voltage. In the illustrated embodiment, the power source 12 may provide a DC voltage to the voltage converter 14.

As illustrated in FIG. 1, an electrical system 10 may include one or more loads 16 that may require different voltages in order to operate. For example, in a certain embodiment, the electrical system 10 may be a laptop computer which includes a processor (L1) requiring 1.45V to operate, a graphics card (L2) requiring 3V to operate, and an optical drive motor (L3) requiring 1.1V to operate. The voltage converter 14 may be utilized to convert the DC voltage provided by the power source 12 to DC voltages that can be used to operate each of the loads 16. In certain embodiments, the voltage converter 14 may be a buck converter, a boost converter, a non-inverting converter, an inverting converter, a single ended primary-inductor converter (SEPIC), a half-bridge switch or any other type of voltage converter 14.

While FIG. 1 illustrates how a voltage converter 14 may provide appropriate voltage levels to one or more loads 16 in an electrical system 10, FIG. 2 illustrates a voltage converter 14 providing appropriate voltage levels to one or more electrical systems 10. As an example, a voltage converter 14 in an industrial plant may step down a relatively high voltage from a power supply to lower voltages that may be used to operate electrical systems 10 and their load 16 in the plant. In other embodiments, each electrical system 10 may include more than one load 16.

In the voltage converters 14 mentioned above, transistors may be utilized in a circuit to facilitate the voltage conversion. Control circuitry in the voltage converter 14 may be designed to apply voltages to one or more terminals of the transistors to activate them to allow current to flow. The control circuitry may strategically activate the transistors in conjunction with other circuitry to effectively convert a voltage level to another voltage level. However, in some embodiments, voltages and currents flowing through the transistors may cause unintentional operating modes that result in erratic operation or damage the control circuitry driving the gates of the transistors or the entire electrical system. In order to protect the control circuitry, an isolation transformer 20, as illustrated in FIG. 3, may provide galvanic isolation between the control circuitry and terminals of the transistors while still applying the control signals to the transistor terminals.

The isolation transformer 20 may include a primary winding 22 with primary winding terminals 24 and a secondary winding 26 with secondary winding terminals 28. As will be shown, in certain embodiments, an isolation transformer 20 may include more than one secondary winding 26. In the illustrated embodiment, the primary winding 22 is substantially co-axial with the secondary winding 26 and the planes of the primary winding 22 and the secondary winding are substantially parallel. When the isolation transformer 20 is in operation, a voltage signal applied to the primary winding terminals 24 may cause a proportional voltage signal to form on the secondary winding terminals 28. The isolation transformer 20 may also include coupling winding 30 that extends through both the primary winding 22 and the secondary winding 26 and forms a closed loop. Although FIG. 3 illustrates the coupling winding 30 having a single loop, other embodiments may include a winding with more than one loop. The coupling winding 30 may include shield terminals 32A and 32B, which may be connected to ground or AC ground.

Figure 3:
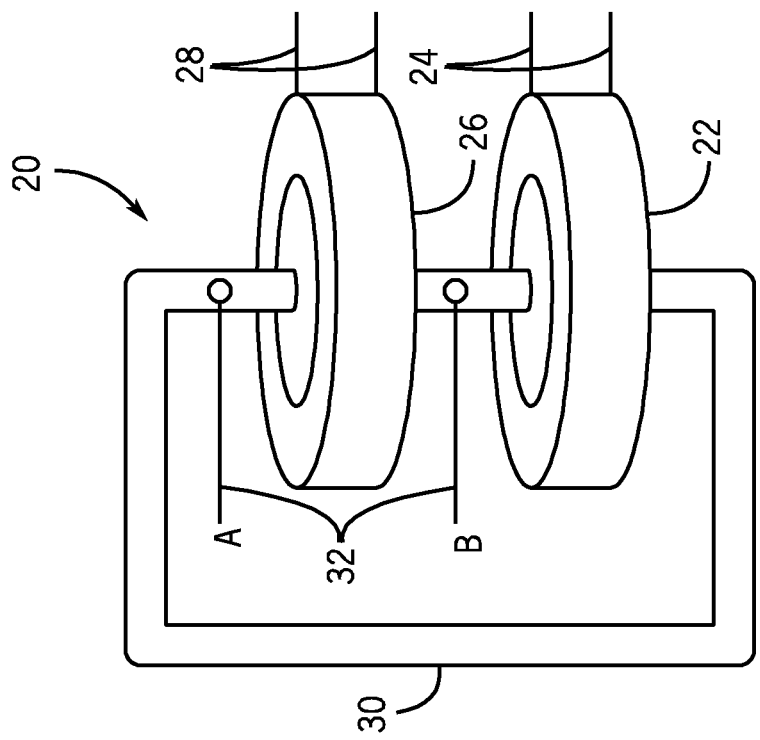
FIG. 3 is an illustration of an isolation transformer in accordance with certain embodiments of the present disclosure.

FIG. 4 illustrates a top view of either the primary winding 22 or the secondary winding 26 illustrated in FIG. 3. The winding 34 may include wiring 36 wrapped a plurality of times around a toroid 38. As illustrated in FIG. 3, the coupling winding 30 extends through the toroid 38 and is insulated from the wiring 36 by an insulating material 40. Each of the primary windings 22 or secondary windings 26 may comprise multiple windings or tapped windings, as is well known to those skilled in the art. In certain embodiments, a capacitance may form between the wiring 36 and the coupling winding 30.

During operation of the isolation transformer, a voltage signal may be applied to the primary winding terminals 24, causing current to flow through the wiring 36 around the toroid 38. The current in the wiring 36 may generate a magnetic field in the toroid 38 encircling the coupling winding 30. As the magnetic field passes through the cross-sectional area formed by the coupling winding 30, a magnetic flux formed in the cross-sectional area may generate a current in the coupling winding 30, which may, in turn, generate a second magnetic field encircling the coupling winding 30. As the second magnetic field passes though the toroid 38 of the secondary winding 26, a magnetic flux may be formed in each cross-sectional area formed by the wiring 36 of the secondary winding 26. The magnetic flux formed in each cross-sectional area may cause current to flow through the wiring 36 of the secondary winding 26, forming a voltage across the secondary winding terminals 28. In this way, applying a voltage to the primary winding terminals 24 may form a voltage on the secondary winding terminals 28 that is directly proportional to the voltage applied to the primary winding terminals 24. By varying the number of turns of the wiring 36 on the toroids 38 of the primary winding 22 and the secondary winding 26, the ratio of the voltage formed on the secondary winding terminals 28 to the voltage applied to the primary winding terminals 24 may be varied.

Figure 5:
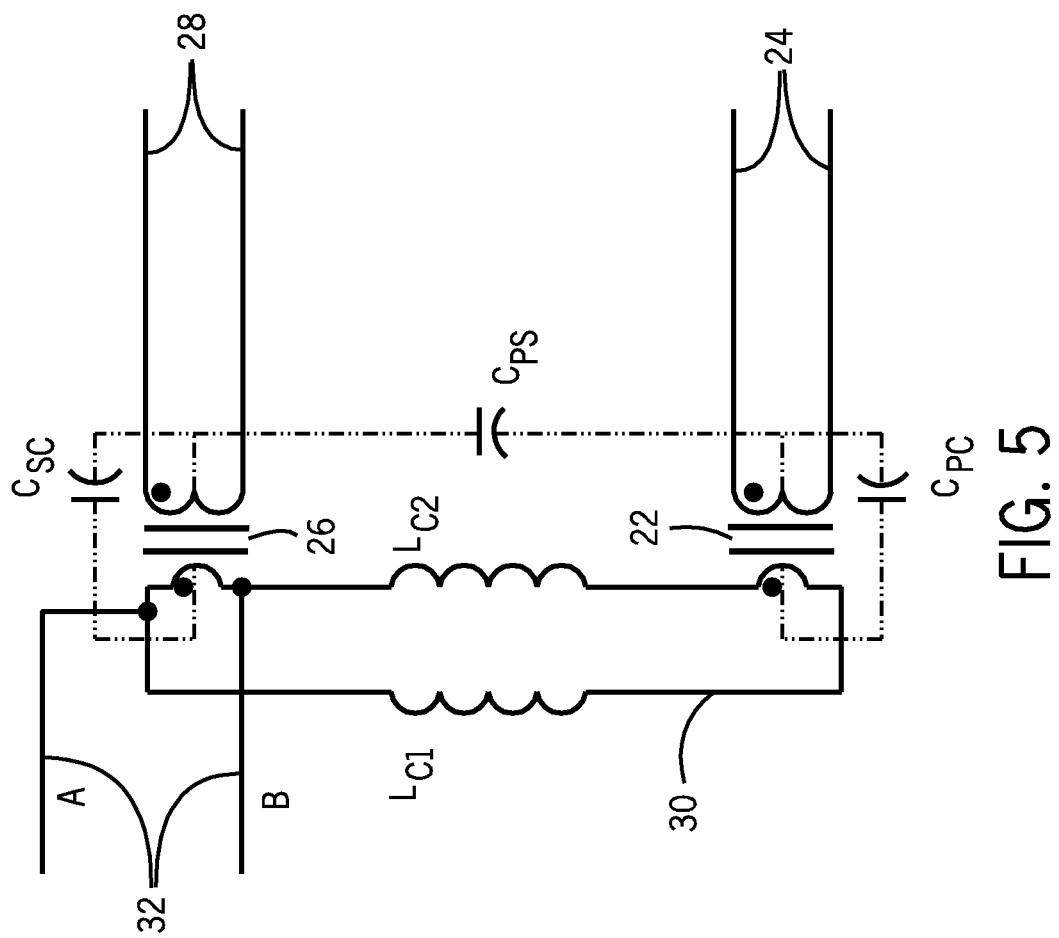
FIG. 5 is a circuit-level diagram of an isolation transformer in accordance with certain embodiments of the present disclosure.

However, during operation, interwinding capacitances in the isolation transformer 20 may provide unwanted current paths through the transformer. FIG. 5 is a circuit-level diagram of the isolation transformer 20 illustrated in FIG. 3 including the interwinding capacitances. A primary capacitance ($C_{pc}$) may form between the primary winding 22 and the coupling winding 30, a secondary capacitance ($C_{sc}$) may form between the secondary winding 26 and the coupling winding 30, and a primary-secondary capacitance ($C_{ps}$) may form between the primary winding 22 and the secondary winding 26.

Figure 6:
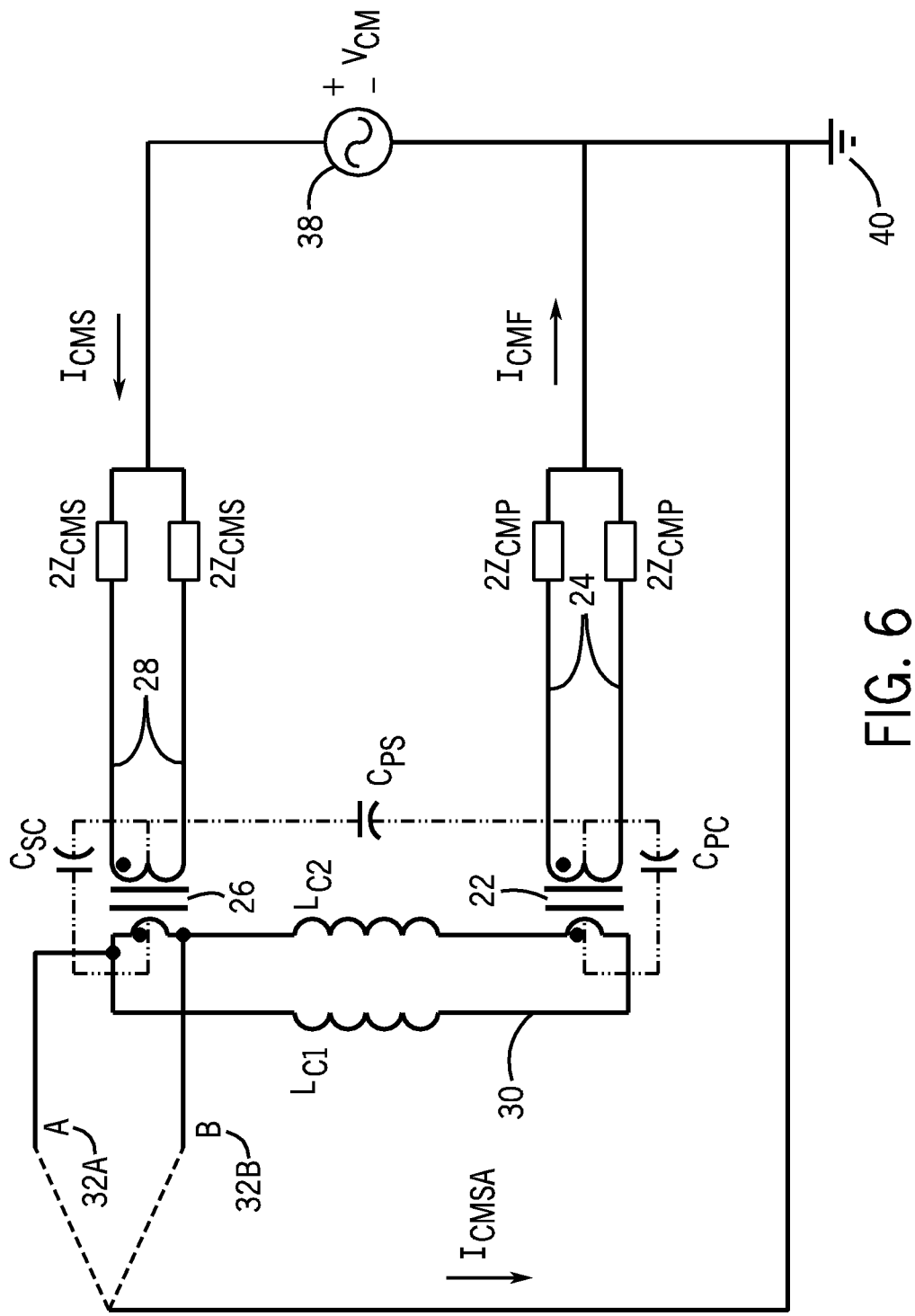
FIG. 6 is a circuit-level diagram of an isolation transformer with common mode currents in accordance with certain embodiments of the present disclosure.

As mentioned above, signals with relatively high voltages, relatively high frequencies, or a combination thereof may cause currents to flow through the interwinding capacitances, potentially damaging circuitry designed to receive galvanic isolation from the isolation transformer 20. FIG. 6 is a circuit diagram that illustrates common mode currents flowing through $C_{pc}$, $C_{sc}$, and $C_{pc}$. During operation of the isolation transformer 20, voltage transitions may cause a common mode voltage $V_{CM}$ 38 to form and a secondary common mode current $I_{CMS}$ to flow in the same direction through both of the secondary winding terminals 28. The secondary winding terminals 28 may include a secondary common mode impedance $Z_{CMS}$ caused by the induction of the secondary winding 26 and the impedance of any circuitry directly attached to the secondary winding terminals 28. Since the total $Z_{CMS}$ impedance is formed in parallel, each secondary winding terminal 28 has an impedance of $2Z_{CMS}$. During a voltage transition, $I_{CMS}$ may split and flow through the $2Z_{CMS}$ impedance on each secondary winding terminal 28.

As will be appreciated, the current flowing through a capacitor is equal to the value of the capacitance of the capacitor multiplied by the change in voltage with respect to time applied across the terminals of the capacitor, as illustrated by the following equation:

$$I(t) = C\frac{dV}{dt}$$

When a voltage transition occurs, the voltage may change quickly with respect to time, making dV/dt a relatively large value, and causing a relatively large amount of current to flow though the capacitor. In the embodiment illustrated in FIG. 6, a voltage transition may cause current to flow through both $C_{ps}$ and $C_{sc}$. The current that flows through $C_{sc}$ may flow through the inductance ($L_{C1}$ and $L_{C2}$) of the coupling winding 30 and through $C_{pc}$. The current may flow out through a primary common mode impedance $Z_{CMP}$ formed in parallel on the primary winding terminals 24 as primary common mode current $I_{CMP}$. If $I_{CMP}$ is large enough, it could potentially damage circuitry to which the isolation transformer 20 is attached.

In order to prevent a large $I_{CMP}$ current flowing from the primary winding 22, shield terminal 32A or shield terminal 32B may be connected through an impedance $Z_{SH}$ to a ground 40. In certain embodiments, the connection to ground may be designed to minimize $Z_{SH}$. $Z_{SH}$ may be much smaller than the other common mode impedances ($Z_{CMS}$, $Z_{CMP}$). In certain embodiments, the common mode impedances may be collectively referred to as $Z_{CMx}$. Ground 40 may be a standard electrical ground or an AC ground. It should be noted that only one of shield terminal 32A or shield terminal 32B may be grounded at a time so that the coupling winding 30 is not shorted. When either shield terminal 32A or 32B is electrically coupled to ground 40, the majority of current flowing through $C_{sc}$ will flow to ground 40 as current $I_{CMSh}$ rather than through $L_{C1}$ or $L_{C2}$ due the fact that $Z_{SH}$ is much smaller than the other common mode impedances. As long as only one of shield terminals 32A or 32B is connected to ground 40 at a time, currents magnetically induced in the coupling winding 30 are unaffected. In this way, $I_{CMP}$ is reduced without affecting the operation of the isolation transformer 20.

Figure 7:
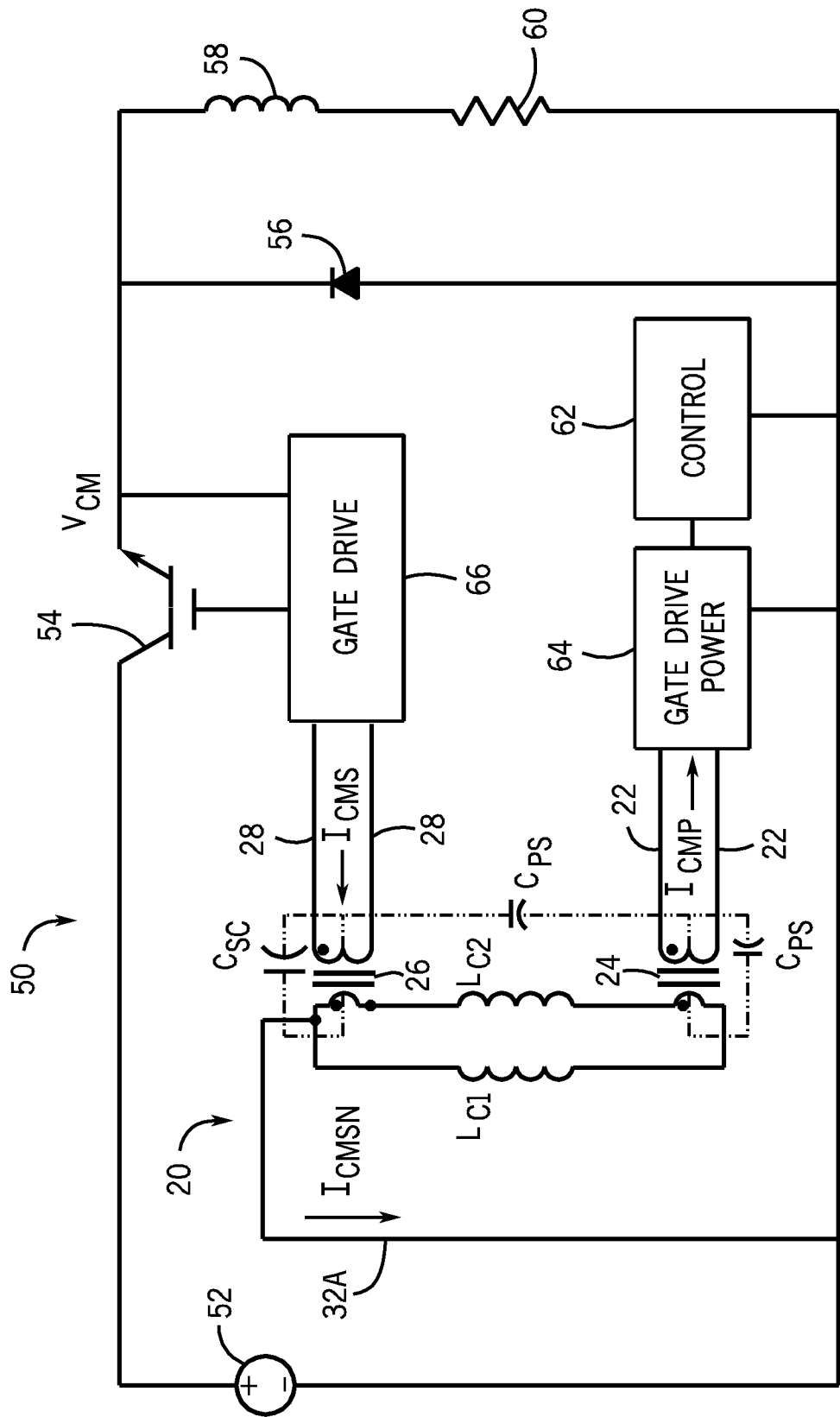
FIG. 7 is an illustration of an isolation transformer driving the gate of a transistor of a buck converter in accordance with certain embodiments of the present disclosure.

As mentioned in relation to FIGS. 1 and 2, an isolation transformer 20 may be utilized in voltage converter 14 circuits to provide isolation between control circuitry and a switching transistor. FIG. 7 illustrates a buck converter 50, a specific voltage converter circuit that utilizes an isolation transformer 20 to provide galvanic isolation between circuit components. A buck converter 50 is a step down voltage converter, meaning that it converts a voltage supplied by a voltage source 52 to a lower voltage. In addition to the voltage source 52, the buck converter 50 may include a switching transistor 54, a diode 56, an inductor 58, and an output load 60. In operation, the voltage source 52 may provide a first voltage to the drain of the switching transistor 54. Depending on the application, the voltage source 52 may have a wide range of voltage values. For example, for a buck converter 50 in a laptop, the voltage source 52 may have a voltage of approximately 5V, but for industrial applications, the voltage source may be 10,000V or more. As the switching transistor 54 is turned on, the voltage at $V_M$ becomes approximately equal in value to that of the voltage source 52. In certain embodiments, the inductor 58 may be positive when the switching transistor 54 is turned off. Since the inductor resists instantaneous changes in current, the diode 56 may turn on to allow the inductor current to remain continuous. At such time, the voltage $V_M$ may become, in the ideal case, approximately equal to ground 40. As is well known, such repetitive switching action can be used to regulate the voltage applied to the load 60. In order to reduce losses due to non-ideal switching behavior in the switching transistor 54 and diode 56, the switching transistor 54 is switched in a manner such that the rate of change of $V_M$ during the transitions is relatively high.

The switching transistor 54 may be turned on and off with control circuitry 62 and gate drive power circuitry 64 configured to apply voltage signals to gate drive circuitry 66. The gate drive circuitry 66 may apply appropriate voltages across the gate and the source of the switching transistor 54 to turn it on or off. In order to keep the voltage across the output load 60 relatively steady, the control circuitry 62 may generate voltage signals to switch the switching transistor 54 on and off rapidly. In certain embodiments, the transistor may be turned on and off at a frequency of up to 100 kHZ. As illustrated in FIG. 7, an isolation transformer 20 may provide galvanic isolation between the gate drive circuitry 66 and the gate drive power circuitry 64 to protect the sensitive control circuitry 62 from the potentially damaging voltages of the voltage source 52.

However, since the switching transistor 54 may be switching at a relatively high frequency, voltage transitions of $V_M$ may form a common mode voltage ($V_{CM}$) at the terminals 28 of the secondary winding and cause the secondary common mode current $I_{CMS}$ to flow through both secondary winding terminals 28. As mentioned above, due to the relatively high frequencies of the common mode current $I_{CMS}$, the current may flow through capacitances $C_{sc}$, $C_{ps}$, and $C_{pc}$, and form primary common mode current $I_{CMP}$. In certain embodiments, $I_{CMP}$ may be large enough to cause damage to the gate drive power circuitry 64 and the control circuitry 62. However, in the illustrated embodiment, shield terminal 32A may be electrically coupled to ground 40, enabling $I_{CMS}$ to flow as $I_{CMSh}$ to ground 40. Since most of $I_{CMS}$ may flow though the shield terminal 32A as $I_{CMSh}$ to ground 40, the primary common mode current $I_{CMP}$, may be reduced.

Figure 8:
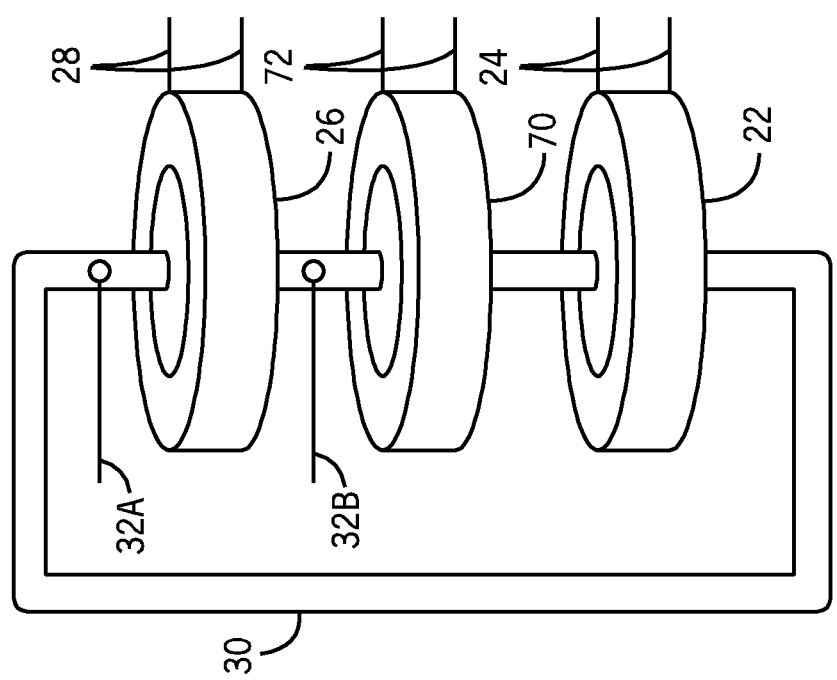
FIG. 8 is an illustration of an isolation transformer with two secondary coils in accordance with certain embodiments of the present disclosure.

In the embodiment illustrated in FIG. 7, the addition of the shield terminal 32A effectively reduces the primary common mode current $I_{CMP}$. However, even when one of the shield terminals 32A and 32B are electrically coupled to ground 40, the secondary common mode current $I_{CMS}$ may still flow though the primary-secondary capacitance and contribute to the primary common mode current $I_{CMP}$. In order to reduce the current flowing though $C_{ps}$, a second secondary winding 70 may be placed between the primary winding 22 and the secondary winding 26, as illustrated in FIG. 8. A voltage may form across a pair of second secondary winding terminals 72 in the same way that an output voltage may form across the secondary winding terminals 28.

Figure 9:
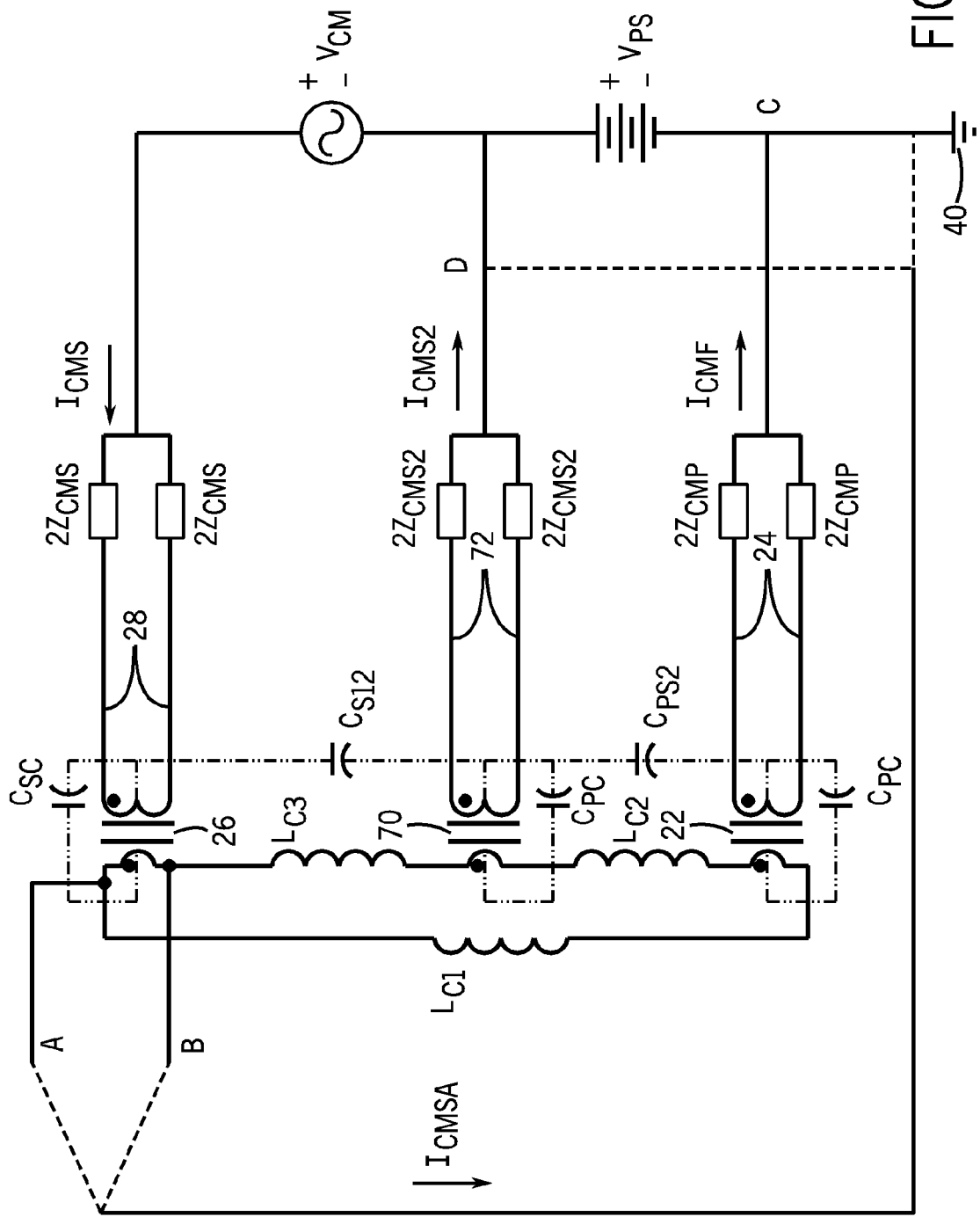
FIG. 9 is a circuit-level diagram of an isolation transformer with two secondary coils in accordance with certain embodiments of the present disclosure.

FIG. 9 illustrates a circuit diagram of an isolation transformer 20 that includes the second secondary winding 70. In the illustrated embodiment, a DC voltage source $V_{PS}$ may form a DC voltage between the primary winding terminals 24 and the second secondary winding terminals 72 that may act as an AC ground. Since $V_{PS}$ may act as an AC ground, shield terminal 32A or 32B may be electrically coupled to either side (point C or point D) of $V_{PS}$. Additionally, since the second secondary winding 70 is formed between the primary winding 22 and the secondary winding 26, the primary-secondary capacitance $C_{PS}$ may be replaced by capacitance $C_{S12}$ and capacitance $C_{PS2}$. As discussed above, all of the secondary common mode current $I_{CMS}$ may not be grounded through $C_{SC}$. In the embodiments illustrated in FIGS. 6 and 7, some of the secondary common mode current $I_{CMS}$ may flow through the primary-secondary capacitance $C_{PS}$ and potentially damage the control circuitry 62. In the embodiment illustrated in FIG. 9, the current which does not flow through $C_{SC}$ may flow through $C_{S12}$ and out through the second secondary winding terminals 72 as current $I_{CMS2}$ to the DC ground formed by the voltage source $V_{PS}$. In this way, the current flowing through $C_{PS2}$ and out through the primary winding terminals 24 as $I_{CMP}$ is reduced even further.

Figure 10:
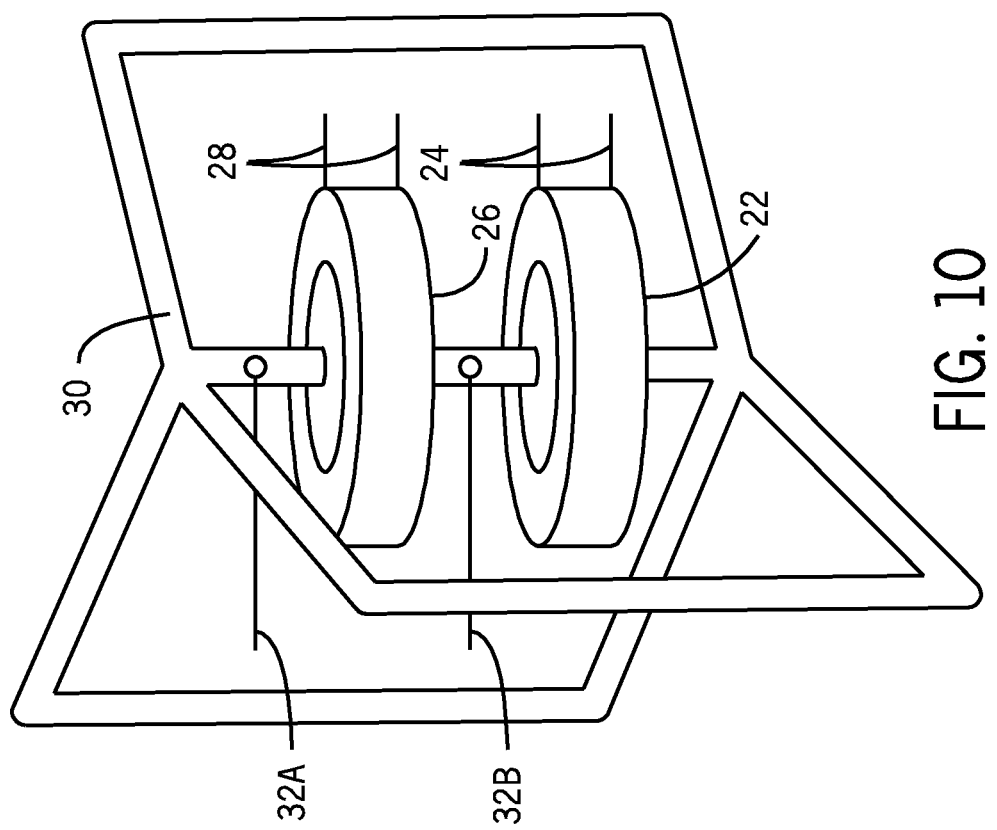
FIG. 10 is an illustration of an isolation transformer with multiple coupling winding loops in accordance with certain embodiments of the present disclosure.
Figure 11:
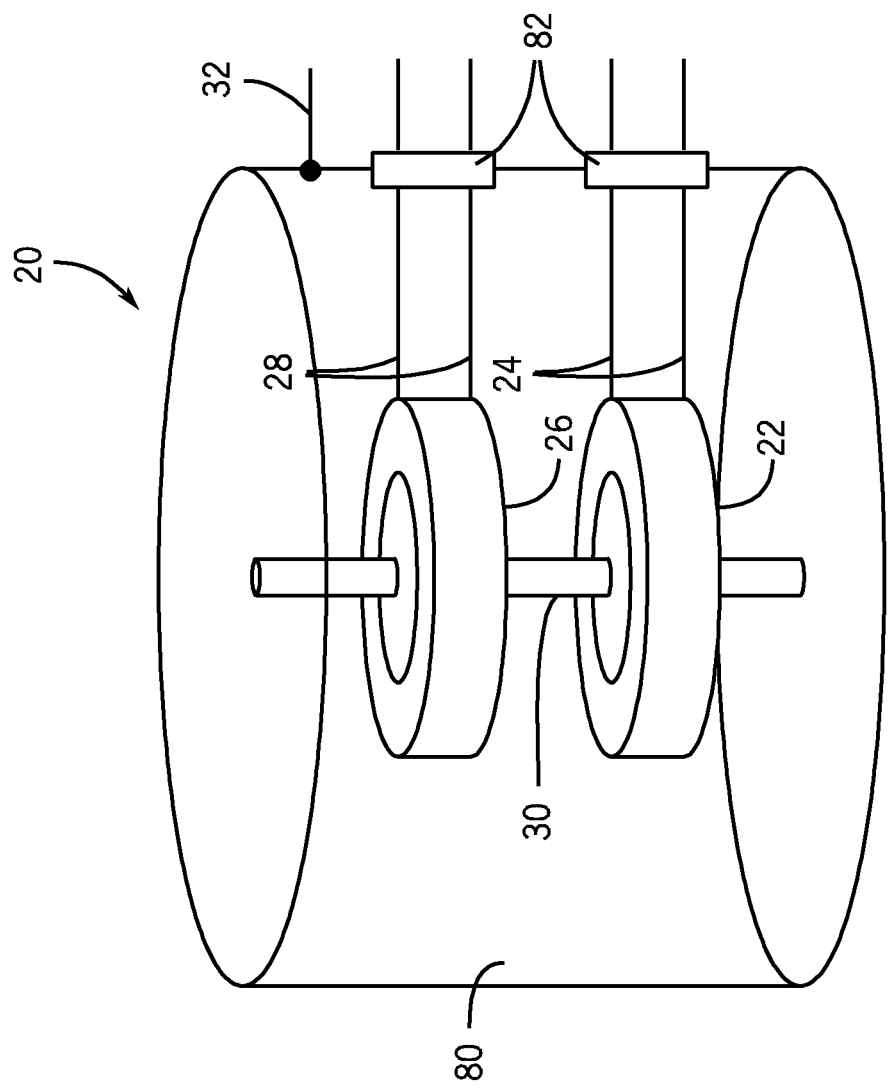
FIG. 11 is an illustration of an isolation transformer enclosed in an external conductive can in accordance with certain embodiments of the present disclosure.

Alternative embodiments of the isolation transformer 20 may improve various operating characteristics of the transformer. For example, in the embodiment illustrated in FIG. 10, additional loops may be added to the coupling winding 30. The additional loops may increase the magnetic coupling between windings, effectively providing improved voltage regulation. Additionally, the additional loops may decrease leakage inductance that may form in the coupling winding 30. In the embodiment illustrated in FIG. 11, the coupling winding 30 of the isolation transformer 20 may be electrically coupled to an external conductive can 80 which surrounds the isolation transformer 20. Although the illustrated embodiment includes a cylindrical external conductive can 80, other embodiments of the external conductive can 80 may include any conductive boundary with any shape that surrounds the isolation transformer 20. The external conductive can 80 may include insulation 82 through which the primary winding terminals 24 and the secondary winding terminals 28 may pass. A shield terminal 32 may be electrically coupled to the external conductive can 80 in order to ground AC currents that may flow through interwinding capacitances. The external conductive can 80 may further reduce the leakage inductance in the coupling winding 30 and may form a shield the entire isolation transformer 20.

FIG. 12 illustrates an alternative embodiment of an isolation transformer 20, where the primary winding 22 and the secondary winding 26 are placed side by side. As illustrated, the planes of the primary winding 22 and the secondary winding 26 may be substantially parallel to one another. The side by side placement may reduce the interwinding capacitance between the primary winding 22 and the secondary winding 26.

Technical effects of the invention include a transformer that includes one or more shield terminals electrically coupled to ground or AC ground. During operation of the transformer, substantially large AC voltages present at the terminals of the transformer may cause common mode currents to flow through interwinding capacitances in the transformer. In certain embodiments, shield terminals provide a path for common mode currents to flow to ground rather than through the interwinding capacitances. In other embodiments, additional winding coils may be added to the transformer to provide shielding between a primary winding of the transformer and a secondary winding of the transformer. The additional winding coils may additionally provide an alternative path to ground or AC ground for the common mode currents, preventing damage to sensitive circuitry that may be electrically coupled to the transformer.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A transformer comprising:
   a primary winding comprising at least one first wiring wrapped a plurality of times around a first toroid;
   a secondary winding comprising at least one second wiring wrapped a plurality of times around a second toroid;
   a coupling winding extending through the first toroid of the primary winding and through the second toroid of the secondary winding, wherein the coupling winding forms at least one closed loop;
   an additional secondary winding placed between the primary winding and the secondary winding; and
   a shield terminal electrically coupled to the coupling winding, wherein the shield terminal is configured to direct a current in the coupling winding to ground
   wherein the transformer provides isolation between a gate drive circuitry and a gate drive power circuitry of a transistor of a converter.

2. The transformer of claim 1, comprising a fixed direct current (DC) voltage source disposed between terminals of the additional secondary winding and terminals of the primary winding.

3. The transformer of claim 2, wherein the shield terminal is electrically coupled to either side of the fixed DC voltage source.

4. The transformer of claim 1, wherein the coupling winding is electrically coupled to an external conductive can.

5. The transformer of claim 1, wherein the primary winding and the secondary winding are substantially co-axial with respect to one another and with respect to the coupling winding.

6. The transformer of claim 1, wherein a first plane in the primary winding and a second plane in the secondary winding are substantially coplanar to one another with respect to the coupling winding.

7. The transformer of claim 1, wherein the current is a common mode current.

8. The transformer of claim 1, wherein the current is an alternating current (AC) current.

9. A voltage converter circuit comprising:
a voltage source;
a transistor configured to allow a current from the voltage source to flow when activated, and to prevent the current from the voltage source from flowing when not activated;
control circuitry configured to activate and deactivate the transistor; and
a transformer disposed between the control circuitry and the transistor configured to provide isolation between the transistor and the control circuitry;
wherein the transformer comprises at least two windings coupled by a coupling winding extending through the at least two windings, and wherein the coupling winding forms at least one closed loop and comprises a shield terminal configured to direct an interwinding current to ground, and
wherein the at least two windings comprises a primary winding comprising at least one first wiring wrapped a plurality of times around a first toroid, a secondary winding comprising at least one second wiring wrapped a plurality of times around a second toroid, and wherein the coupling winding extends through the first toroid of the primary winding and through the second toroid of the secondary winding, and
further wherein the transformer comprises an additional secondary winding placed between the primary winding and the secondary winding
wherein the transformer provides isolation between a gate drive circuitry and a gate drive power circuitry of a transistor of a converter.

10. The voltage converter circuit of claim 9, wherein the interwinding current is formed from voltage transitions formed when the transistor is activated.

11. The voltage converter circuit of claim 9, wherein the interwinding current comprises an alternating current (AC) current which flows through one or more interwinding capacitances of the transformer.

12. The voltage converter of claim 9, wherein the voltage converter comprises a buck converter, a boost converter, a non-inverting converter, an inverting converter, or a single ended primary-inductor converter (SEPIC), or a half-bridge switch.

13. The voltage converter of claim 9, wherein the interwinding current flows through a capacitance formed between the coupling winding and the primary winding, a capacitance formed between the coupling winding and the secondary winding, and a capacitance formed between the primary and the secondary winding.

14. A method for maintaining galvanic isolation between a power source and a load comprising:
electrically coupling a transformer between the power source and the load wherein the transformer comprises a primary winding comprising at least one first wiring wrapped a plurality of times around a first toroid, a secondary winding comprising at least one second wiring wrapped a plurality of times around a second toroid; and a coupling winding extending through the first toroid of the primary winding and through the second toroid of the secondary winding, wherein the coupling winding forms at least one closed loop;
electrically coupling the coupling winding of the transformer to ground, wherein electrically coupling the coupling winding of the transformer to ground comprises electrically coupling a shield terminal to the coupling winding at a single point;
placing an additional secondary winding between the primary winding and the secondary winding to reduce a current flowing through a capacitance formed between the primary winding and the one or more secondary windings; and
configuring the transformer to provide isolation between a gate drive circuitry and a gate drive power circuitry of a converter configured to convert a DC voltage provided by the power source to a DC voltage appropriate for the load.

15. The method of claim 14, comprising electrically coupling the coupling winding of the transformer to a fixed direct current (DC) voltage source.

* * * * *